United States Patent
Chen et al.

(10) Patent No.: US 7,271,651 B2
(45) Date of Patent: Sep. 18, 2007

(54) HIGH PERFORMANCE DIFFERENTIAL AMPLIFIERS WITH THICK OXIDE DEVICES FOR HIGH IMPEDANCE NODES

(75) Inventors: Mingdeng Chen, Harleysville, PA (US); Jonathan Fischer, Longmont, CO (US)

(73) Assignee: Agere Systems Inc., Allentown, PA (US)

( * ) Notice: Subject to any disclaimer, the term of this patent is extended or adjusted under 35 U.S.C. 154(b) by 176 days.

(21) Appl. No.: 11/155,430

(22) Filed: Jun. 17, 2005

(65) Prior Publication Data

US 2006/0290426 A1    Dec. 28, 2006

(51) Int. Cl.
*H03F 3/45* (2006.01)

(52) U.S. Cl. ...................... 330/253; 330/254

(58) Field of Classification Search ............. 330/253, 330/254, 258; 327/328, 359, 543, 563
See application file for complete search history.

(56) References Cited

U.S. PATENT DOCUMENTS

| 4,048,575 | A | * | 9/1977 | Musa ...................... 330/253 |
| 4,742,308 | A |   | 5/1988 | Banu |
| 5,281,924 | A | * | 1/1994 | Maloberti et al. ........... 330/253 |
| 6,677,822 | B2 | * | 1/2004 | Hasegawa .................... 330/258 |
| 6,778,569 | B2 |   | 8/2004 | Fischer |

OTHER PUBLICATIONS

Christensen, Tom, "Hard disk drive read channels 'a must for perpendicular recording'", http://www.planetanalog.com/show/Article?articleID=20900003 (May 20, 2004).

* cited by examiner

*Primary Examiner*—Khanh Van Nguyen
(74) *Attorney, Agent, or Firm*—Priest & Goldstein, PLLC

(57) ABSTRACT

A circuit is described which uses a thick gate oxide device in the input stage and a thin gate oxide device in a second stage that is connected to the input stage. The input stage thick gate oxide device provides a low input gate leakage current. The thin gate oxide device in the second stage has high performance characteristics due to the use of the thin gate oxide device. The circuit thereby has high performance characteristics and low input gate leakage current. In various applications, the circuit may be, for example, an amplifier, a differential amplifier, a variable gain differential amplifier, or an operational amplifier in a sample and hold circuit. A guideline is provided where the thick gate oxide layer is about 1.5× the thickness of the thin gate oxide layer. Also, a design to control the circuit's common mode voltage using common mode voltage feedback is described.

20 Claims, 8 Drawing Sheets

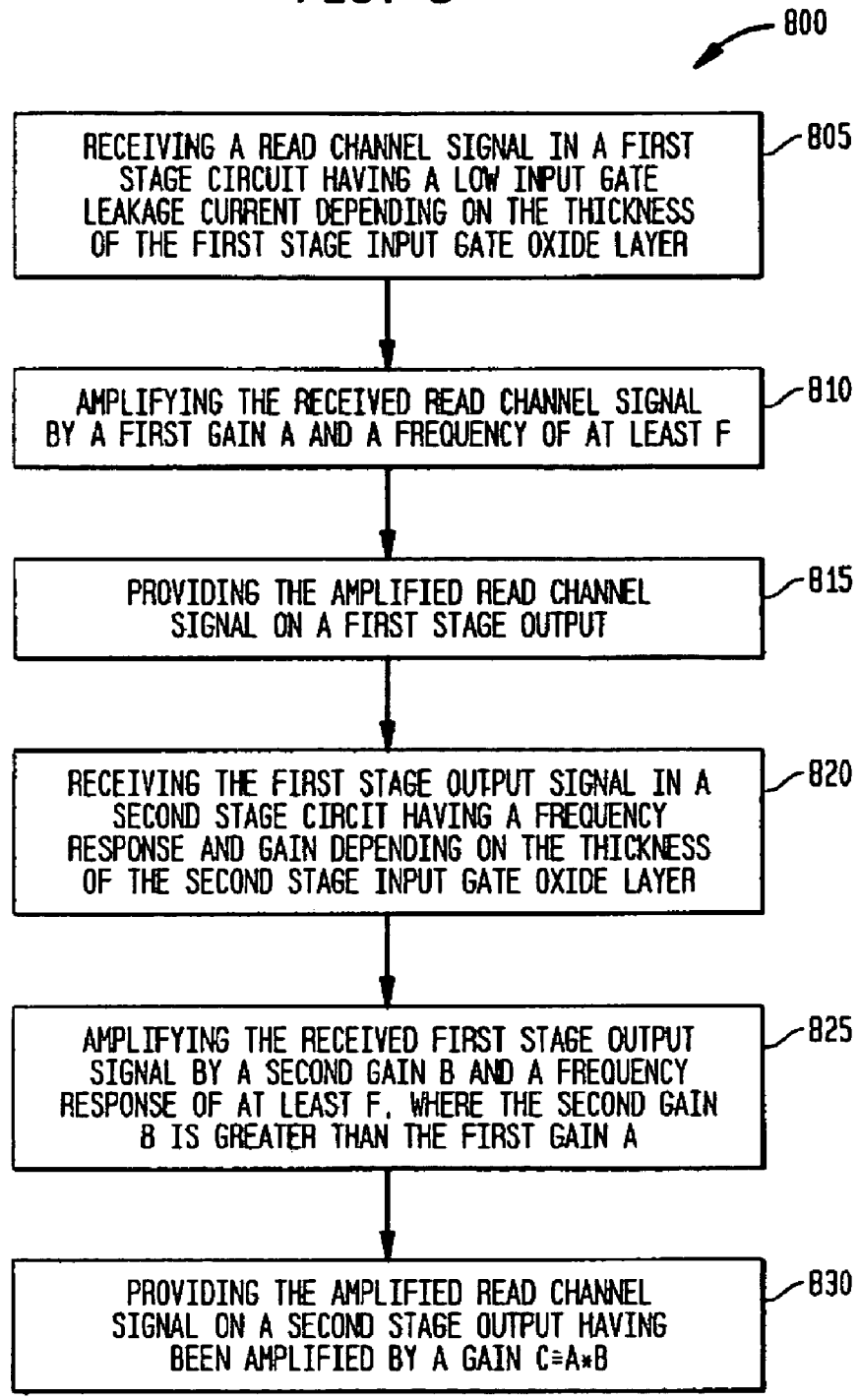

HIGH PERFORMANCE DIFFERENTIAL AMPLIFIERS WITH THICK OXIDE DEVICES FOR HIGH IMPEDANCE NODES

FIELD OF INVENTION

The present invention relates generally to improved analog circuits with reduced input gate leakage current, and more particularly, to advantageous techniques for high performance differential amplifiers having thick oxide input devices with reduced input gate leakage current.

BACKGROUND OF INVENTION

Circuits that interface with various types of sensors require analog front ends for amplifying and filtering sensor signals. To take advantage of increasingly dense technologies such as provided by metal oxide semiconductor (MOS) technologies, and the ability to integrate analog and digital circuits on the same silicon die, the analog front ends may be implemented in MOS technologies. Many times, the front end analog circuits use differential amplifiers to provide good noise rejection of sensor inputs or transmitted signals. Differential amplifiers designed in MOS technology for high performance applications will typically utilize high performance MOS devices implemented with thin gate oxide thickness. In these designs, a thin gate oxide thickness is typically employed to meet high performance requirements by providing fast signal response. As technology continues to scale to smaller and smaller dimensions, such as found in 90 nanometer (nm) technology, for example, the gate oxide layer also reduces in thickness in order to provide improved performance levels.

This reduction in oxide thickness is not without its problems. For example, with reduced gate oxide layer thickness to provide the required performance levels, there is an increase in gate leakage current. This increase is in part due to tunneling of charge carriers through the thin gate oxide and the consequent effect on gate leakage current and common mode voltage variations when operating throughout the input voltage range. The effects of gate leakage current can be considerable. For example, in a sample and hold circuit the voltage held in a hold capacitor connected to an input device will discharge at a rate, referred to as the droop rate, in part due to input gate leakage current of the input device. With an input device having a reduced gate oxide layer thickness, the gate leakage current could be relatively large resulting in a high droop rate.

For applications requiring high performance and high gain amplifiers in analog front end circuits, these problems must be addressed in order to meet the requirements in an existing process technology and to have the front end design be scalable to increasingly dense technologies.

SUMMARY OF INVENTION

Among its several aspects, the present invention recognizes that there is a need for improved high performance and high gain amplifiers to be used in analog front end circuits that may be implemented in existing process technologies and may be scalable to increasingly dense technologies. By way of example, such circuits may be advantageously employed in a read-channel front end of a perpendicular recording disk drive system.

To these ends, an embodiment of the present invention includes a two stage analog amplifier circuit in which a first stage input device receives an input signal at a first input gate. The first input gate has a thick gate oxide layer where the thickness of the thick gate oxide layer is chosen so that the first stage input device has a low input gate leakage current. The first stage also produces a first stage output signal. The circuit further includes a second input device that receives the first stage output signal at a second input gate. The second input gate has a thin gate oxide layer where the thickness of the thin gate oxide layer is less than the thickness of the thick gate oxide layer of the first input device.

Another embodiment of the present invention addresses a two stage differential amplifier with a first stage having differential input devices with first input gates receiving a differential input. Each of the first input gates has a thick gate oxide layer where the thickness of the thick gate oxide layer is chosen so that the first stage differential input devices have a low input gate leakage current. The first stage having a common mode voltage output that is controlled using a common mode signal. The first stage also produces a first stage differential output signal. The circuit further includes second differential input devices with second input gates receiving the first stage differential output signal. The second input gates have a thin gate oxide layer where the thickness of the thin gate oxide layer is less than the thickness of the thick gate oxide layer of the first stage differential input devices.

Another embodiment of the present invention addresses a method for amplifying a read channel signal with a gain C, frequency response F, and low input gate leakage current. The method includes receiving a read channel signal in a first stage circuit having a low input gate leakage current depending on the thickness of the first stage input gate oxide layer. Next, the read channel signal is amplified by a first gain A and frequency response of at least F. The amplified signal is then provided on a first stage output. In the next step the first stage output signal is received in a second stage circuit having a frequency response and gain depending on the thickness of the second stage input gate oxide layer. The thickness of the second stage input gate oxide layer is less than the thickness of the first stage input gate oxide layer. The first stage output signal is then amplified by a second gain B and frequency response of at least F, where the second gain B is greater than the first gain A. The amplified read channel signal is provided on a second stage output where the read channel signal is amplified by a gain $C \cong A*B$.

A more complete understanding of the present invention, as well as other features and advantages of the invention, will be apparent from the following detailed description and the accompanying drawings.

BRIEF DESCRIPTION OF DRAWINGS

FIG. 8 illustrates a method of amplifying a signal in accordance with the present invention.

DETAILED DESCRIPTION

The present invention will now be described more fully with reference to the accompanying drawings, in which several embodiments and various aspects of the invention are shown. This invention may, however, be embodied in various forms and should not be construed as being limited to the embodiments set forth herein. Rather, these embodiments are provided so that this disclosure will be thorough and complete, and will fully convey the scope of the invention to those skilled in the art.

Figure 1:
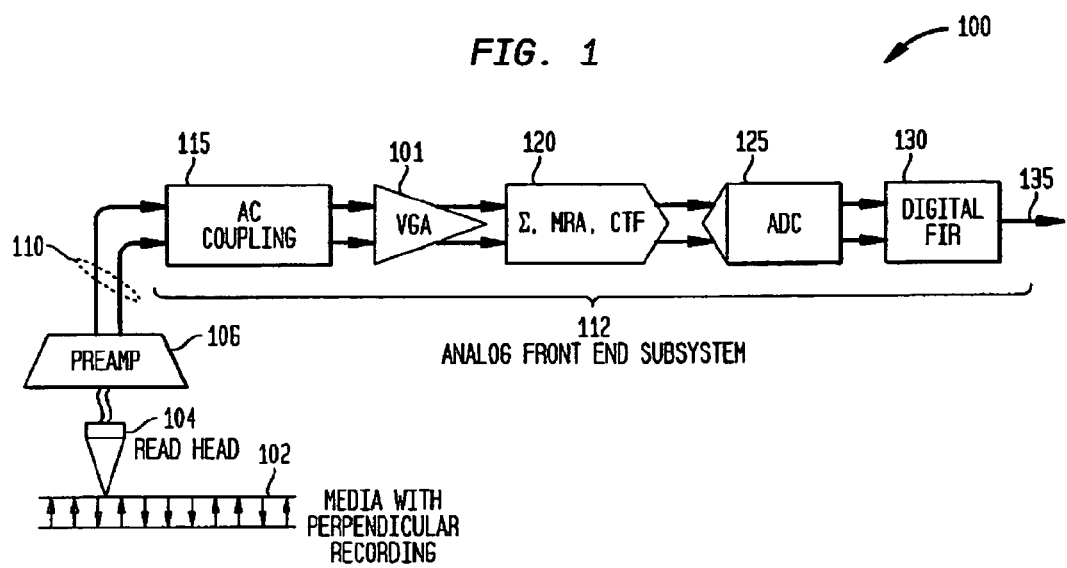
FIG. 1 illustrates an exemplary analog subsystem for a perpendicular recording disk drive system utilizing a high performance differential variable gain amplifier in accordance with the present invention.

FIG. 1 illustrates an exemplary analog subsystem 100 for a perpendicular recording disk drive system utilizing a high performance differential variable gain amplifier (VGA) 101 in accordance with the present invention. It will be appreciated that other systems and front end analog circuits may benefit from the teachings of the present invention. For example, sample and hold circuits, amplifiers in high impedance nodes, and thin-oxide gain stage devices may all benefit from aspects of the present invention.

The requirements of the analog subsystem 100 designed for use in a perpendicular recording disk drive system are significantly more stringent then those for a subsystem for use in conjunction with a horizontal recording technique which is the primary recording technology used in present day disk drives. The perpendicular recording technology stores data in closely packed vertical magnetized units on a media 102, such as a read/write disk. A read head 104, optimized for perpendicular recorded media 102, senses the vertical magnetized units to produce a signal that is closely coupled to a preamp 106 which provides a first stage of amplification of the read head signal. The preamp 106 is typically located close to the read head 104 and provides a differential output 110 to drive the amplified signal to an analog front end subsystem 112 which might be located on a disk drive card, for example. An AC coupling circuit 115 is used to remove most of any DC offset that is part of the preamp signal. The AC coupling unit 115 is connected to the differential variable gain amplifier (VGA) 101 which employs an automatic gain control loop to determine an adequate amount of gain that is required by the rest of the front end circuitry. The differential VGA 101 connects to a process circuit 120 for processing the signal from the VGA 101 by a summing function ($\Sigma$), a magneto resistive (MR) asymmetry correction function, and a continuous time filtering (CTF) function. Following process circuit 120, the processed signal is supplied to an analog to digital converter (ADC) 125 to convert the analog signal to a digital form which is then filtered in a digital finite impulse response (FIR) filter 130 that provides an output 135 for further digital processing and data capture.

Figure 2:
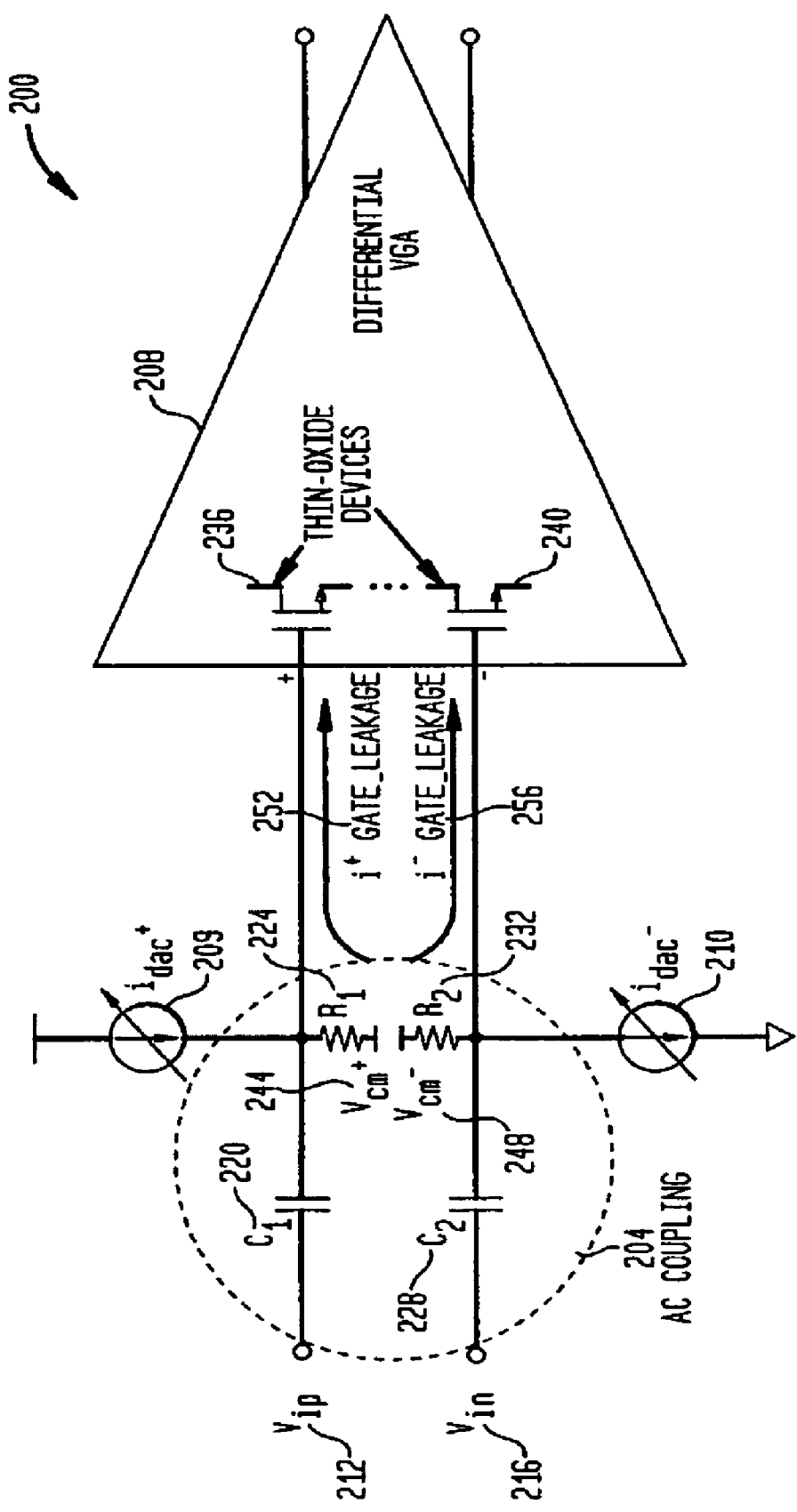
FIG. 2 illustrates an AC coupled differential amplifier having an AC coupling circuit, current digital to analog converters (DACs), and a differential variable gain amplifier (VGA)

FIG. 2 illustrates an AC coupled differential VGA 200 having an AC coupling circuit 204, current digital to analog converters (DACs) 209 and 210, and a differential VGA 208, corresponding to AC coupling circuit 115 and VGA 101 of FIG. 1. For example, the differential VGA 208 might provide 0-24 dB or more of gain in a specific application. With the perpendicular recording system 100, the sensor voltages, at the input to the preamp 106, are typically not DC free. The AC coupling circuit 115 low frequency corner is set to a low frequency in order to make the dominant AC coupling be from the preamp. The preamp output signals $V_{ip}$ 212 and $V_{in}$ 216 are coupled to the differential VGA 208 through high pass filters in the AC coupling unit 204 with the filters' low frequency corners set at 35 kHz or lower, for example. The high pass filter on the $V_{ip}$ 212 is made up of capacitor $C_1$ 220 and resistor $R_1$ 224. The high pass filter on the $V_{in}$ 216 is made up of capacitor $C_2$ 228 and resistor $R_2$ 232. The capacitors $C_1$ 220 and $C_2$ 228 are matched and set, for example, to a value of 2.5 pF. The resistors $R_1$ 224 and $R_2$ 232 are matched and set, for example, to a value of 2 M$\Omega$ or larger. In order to achieve high gain as well as high speed, thin gate oxide devices 236 and 240 are used in the differential VGA 208 input stage. Due to the use of the thin gate oxide devices and mismatches in the devices 236 and 240, the positive (+) and negative (−) gate leakage currents, $i^+_{gate\_leakage}$ 252 and $i^-_{gate\_leakage}$ 256, will not be the same and may be of significant value, which, when coupled with temperature instabilities, can create large differential as well as common-mode offsets. Changing the thin gate oxide devices 236 and 240 to thick gate oxide devices is usually not acceptable since the thick gate oxide devices will limit the achievable speed of the differential VGA 208 and generally cause an increase in power consumption and an increase in silicon die area.

The transistor speed in analog applications is a function of gm/C where gm is the transistor transconductance and C is the total load capacitance. The transconductance is proportional to $$gm \propto \left(\frac{W}{L}\frac{I}{Tox}\right)^n$$

where W is the device gate width, L is the device gate length, I is the transistor bias current, Tox is the gate oxide thickness, and n is ½ or less due to short channel and velocity saturation effects. Though there is a wide range of gate oxide thicknesses and consequent device characteristics, a given technology may only support a few thickness choices for a manufacturing line. For example, a thick gate oxide device in a 90 nm technology may have an oxide gate thickness of approximately 65-70 angstroms, where 1 angstrom equals 0.1 nm. A thin gate oxide device in 90 nm technologies may have an oxide thickness of 16-22 angstroms, which is less than about ⅓ the thickness of the thick gate oxide device. In another example, a thick gate oxide thickness of 21-27 angstroms and a thin gate oxide thickness less than or equal to about ⅔ the thickness of the thick gate oxide device, about 14-18 angstroms or less, might also be an acceptable choice provided by a technology. With a given thin gate oxide thickness, such as from the last example of 14-18 angstroms, the thickness of the thick gate oxide device would be greater than or equal to about 1.5 the thickness of the thin gate oxide device, about 21-27 angstroms or greater.

To get the same speed, equivalently the same transconductance, from a thick gate oxide device as can be obtained with a thin gate oxide device generally requires more bias current than is employed by the thin gate oxide device. Because of device scaling constraints, the thick gate oxide devices also have longer minimum gate lengths than the thin gate oxide devices, so the thick gate oxide device might need to be wider than a thin gate oxide device to have the same transistor transconductance (gm) at a given bias current. Making the thick gate oxide device wider also increases the parasitic capacitance, limiting the benefit from widening the device. The net effect is that thick gate oxide devices tend to be slower and require more silicon area than thin gate oxide devices. On the other hand, the thickness of the gate oxide layer directly affects the gate leakage current.

FIG. 2 also shows two current mode digital to analog converters (DACs) 209 and 210 which are used to compensate for input gate leakage current of the differential VGA 208 having thin oxide input devices 236 and 240. The current mode DACs 209 and 210 supply currents that are adjusted to compensate for the mismatch in the $i_{gate\_leakage}$ currents 252 and 256 and thereby reduce the offset due to the mismatch. Since there are variations in the $i_{gate\_leakage}$ currents 252 and 256 due to temperature variations, the DAC current must be periodically or continuously calibrated to fully compensate for these variations. In addition, the design of the current mode DACs 209 and 210 must take into account the challenge of accurately generating small currents, on the order of nano-Amperes for proper operation.

Figure 3:
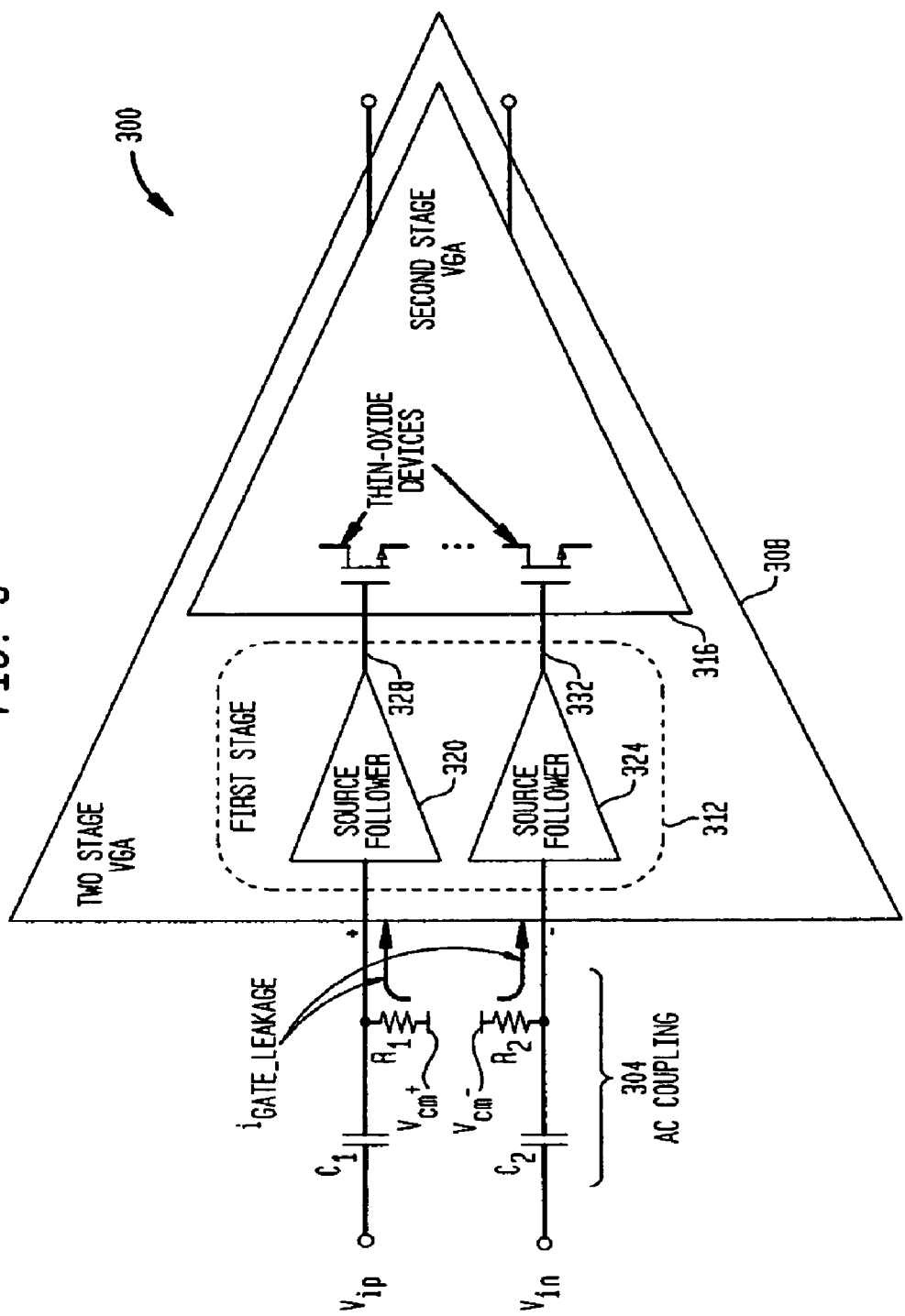
FIG. 3 illustrates an AC coupled variable gain amplifier (VGA) subsystem having an AC coupling circuit and a two stage VGA with a first stage to provide improved input characteristics in accordance with the present invention.

FIG. 3 illustrates an AC coupled VGA subsystem 300 in accordance with the present invention. The AC coupled VGA subsystem 300 has an AC coupling circuit 304 and a two stage VGA 308 with a first stage 312 to provide the two stage VGA 308 with improved input characteristics. The first stage 312 is made up of source follower circuits 320 and 324, both made with thick gate oxide devices. A second stage VGA 316 has its inputs 328 and 332 connected to the source followers 320 and 324, respectively. Since source followers generally provide less than unity gain, they may add their own noise into the second stage VGA 316. Also, since the source followers are each manufactured as separate sections of silicon, their operating characteristics will not exactly match and variations due to the manufacturing process, voltage, and temperature can cause differential voltage offset and common mode voltage variations. The common-mode voltage variation may limit the headroom of the following gain stages. As a consequence, the design of the second stage VGA 316 must take these constraints and variations of the source followers into account.

Figure 4:
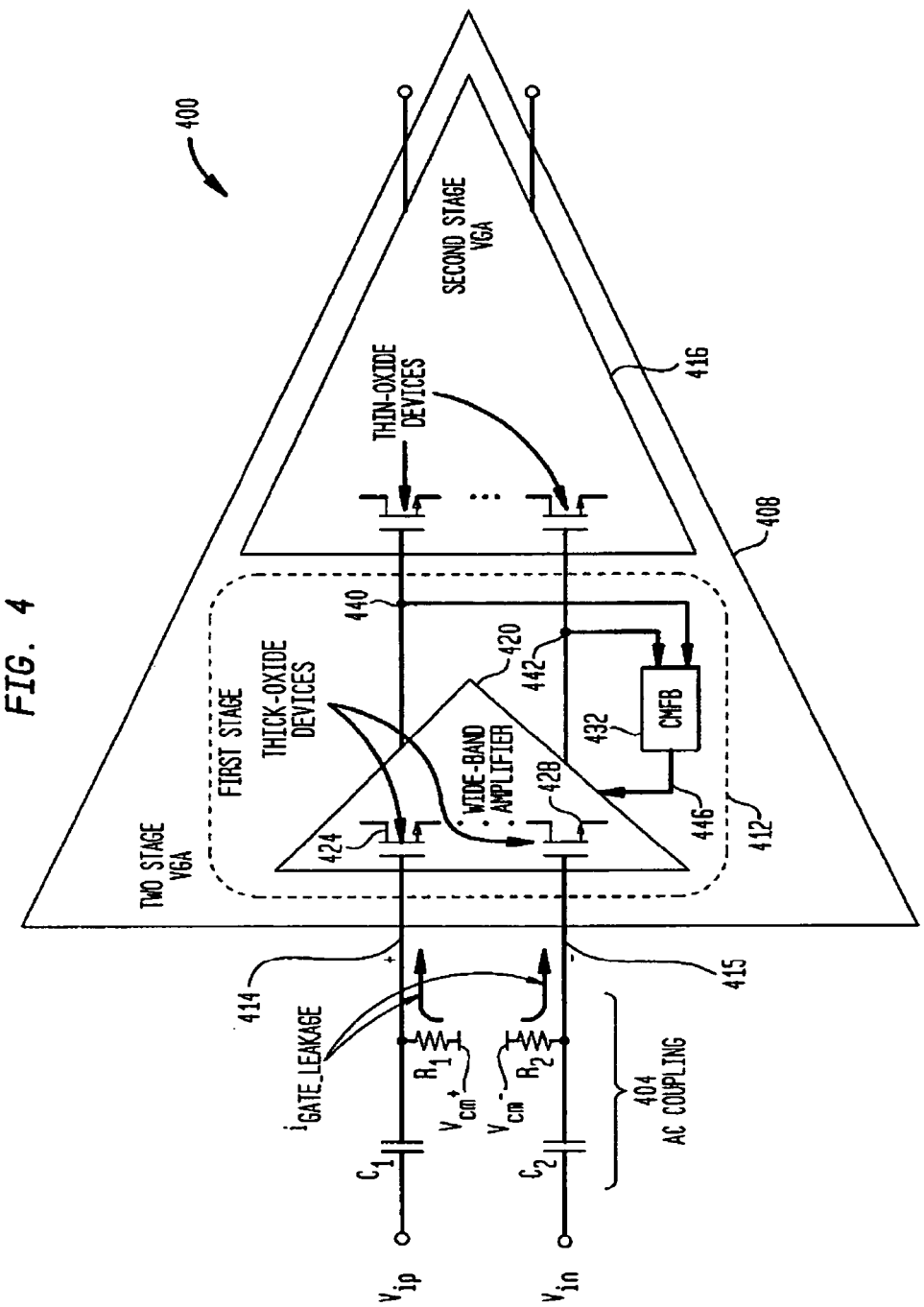
FIG. 4 illustrates an AC coupled second VGA subsystem having an AC coupling circuit and a second two stage VGA with a first stage to provide improved input characteristics in accordance with the present invention.

An AC coupled second VGA subsystem 400 in accordance with the present invention is shown in FIG. 4. The AC coupled second VGA subsystem 400 has an AC coupling circuit 404 and a two stage VGA 408 with an advantageous first stage 412. The AC coupled second VGA subsystem 400 has inputs 414 and 415 which may be suitably used in the analog front end subsystem 100. The first stage 412 is made up of a moderate gain, on the order of 1-4 dB, wideband differential amplifier 420 using thick gate oxide devices 424 and 428 in its input stage and an exemplary common mode feedback (CMFB) circuit 432. For further details regarding CMFB, see for example, U.S. Pat. No. 4,742,308 entitled "Balanced Output Analog Differential Amplifier Circuit" which is incorporated by reference herein in its entirety. The first stage 412 is used to provide the two stage VGA 408 with improved input characteristics. By using thick gate oxide devices, such as, thick gate oxide devices 424 and 428, the gate leakage problem of using a VGA with thin gate oxide input devices is significantly reduced.

For example, the gate leakage of a 6.5-7.0 nm gate oxide device is generally considered negligible, while a 1.6-2.2 nm gate oxide device has a significant gate leakage current density of approximately 50 nano Amps/um$^2$ in a 90 nm technology. The 1.6-2.2 nm gate oxide is so thin that there is significant leakage current from the CMOS gate to the channel between the drain and source. The gate leakage current is due to carrier direct tunneling. The thick gate oxide device also handles a wider voltage range for operation, such as 3.3 volts for the 6.5-7.0 nm gate oxide devices and 1.0 volts for the 1.6-2.2 nm gate oxide devices. It is presently preferred to have a ratio of at least 1.5 between the thickness of a thick gate oxide device and a thin gate oxide device While this ratio is presently preferred, it will be recognized that fabrication technologies are constantly evolving and that depending upon the technology and device requirements, lower ratios might be perfectly acceptable and still provide the benefits of the design as described herein.

Since the wideband differential amplifier 420 does not provide large gains, the wideband differential amplifier 420 can be designed for high performance characteristics in line with the requirements for the two stage VGA 408. By connecting the first stage 412 to a second stage VGA 416, high performance characteristics of the two stage VGA 408 can be achieved, in part, by splitting the gain required by the system between the wideband differential amplifier 420 and the second stage VGA 416.

By using a differential amplifier and the common-mode feedback (CMFB) circuit 432, the variation of the common mode voltage (CMV) of the two stage VGA 408 is well controlled. It is noted that a common-mode feed forward circuit may also be used to set the output common-mode voltage. With the well controlled input common-mode voltage, the headroom of the following gain stage can be improved and may use a VGA structure whose gain varies with the input common-mode voltages to some extent. Using CMFB for the wideband amplifier stage is not mandated, but it advantageously provides improved control of the common-mode voltage and an improved common-mode rejection ratio. The use of CMFB might be considered important if the following high gain stage does not have very good input common-mode rejection characteristics. Also, using CMFB for the wideband amplifier stage can simplify the design of the high gain stage, since the high gain stage can take advantage of the CMV control provided by the wideband amplifier stage.

Figure 5:
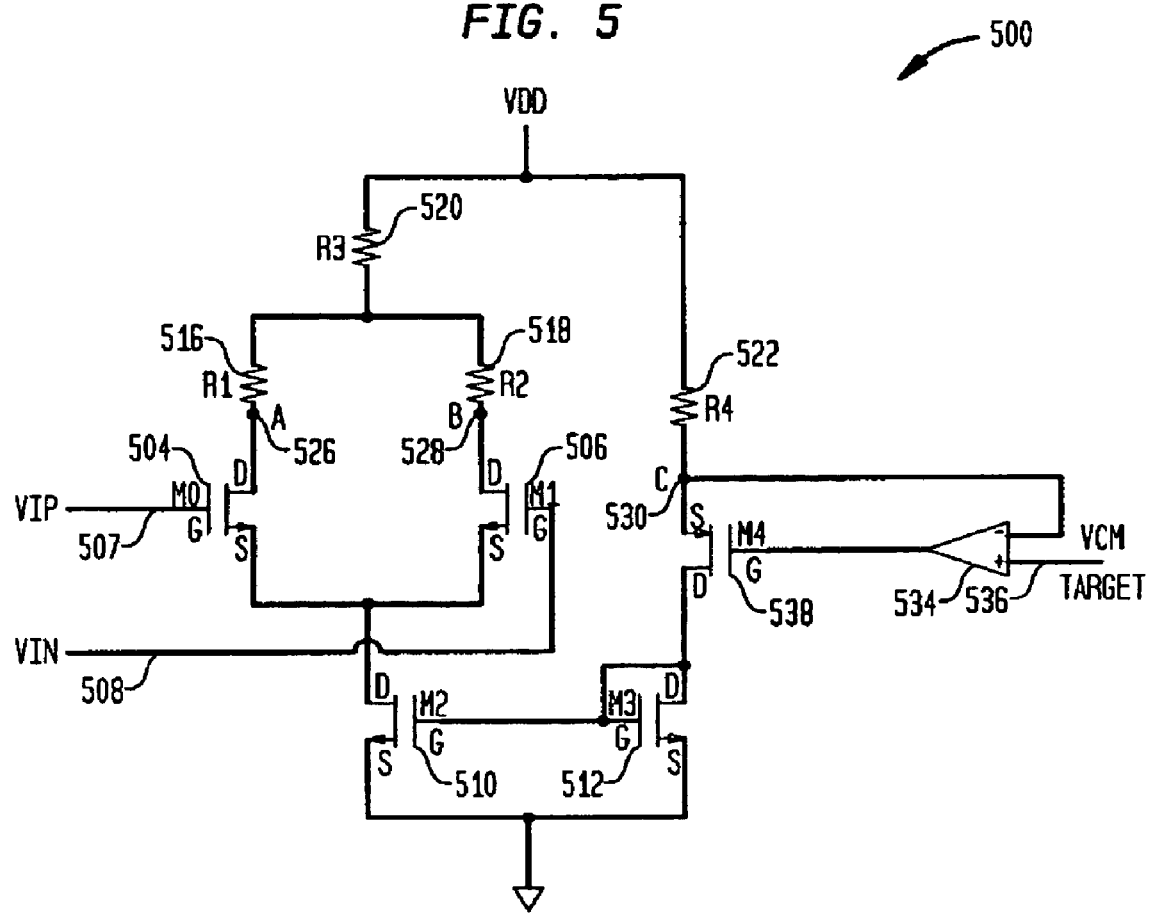
FIG. 5 illustrates an exemplary wideband differential amplifier with common-mode feed forward control that uses thick gate oxide devices on the differential inputs in accordance with the present invention.

An example of a wideband differential amplifier 500 in accordance with the present invention is shown in FIG. 5. Amplifier 500 employs n-type metal oxide semiconductor (NMOS) transistors M0, M1, M2, M3, and p-type (PMOS) transistor M4, each with a thick gate oxide layer and using a design that provides common-mode feed forward control. The transistors are indicated with drain connections D, source connections S, and gate connections G. Thick gate oxide devices M0 504 and M1 506 connect to differential inputs, positive input voltage (VIP) 507 and negative input voltage (VIN) 508, respectively. The circuit relies on matching between the transistors M2 510 and M3 512 and having accurate values for resistors R1 516, R2 518, R3 520, and R4 522 depending upon the gain to be achieved and for setting the common mode voltage at nodes A 526 and B 528 to track node C 530. The voltage at node C 530 is set by the amplifier 534 to track the common mode voltage (VCM) target value 536 that may be generated by a bandgap reference. The matching of the resistors R1 516, R2 518, R3 520, and R4 522 to specified values may be obtained within a few percent in a typical fabrication process. The output common mode voltage $$V_{CM} = \frac{V_A + V_B}{2}$$

is set by controlling the current through M2 510. The amplifier 534 and M4 538 adjusts the voltage drop across R4 522 to keep node C at the desired VCM target voltage. The current through M4 538 is mirrored by M3 512 into M2 510 to have the common mode voltage at nodes A and B track the voltage at node C.

The outputs of the wideband differential amplifier 500 may be, for example, provided at nodes A 526 and B 528 which can be connected to the input of a following second stage VGA. Using the AC coupled second VGA subsystem 400 of FIG. 4 as an example, the wideband amplifier 500 can be used to replace the first stage 412 by removing the first stage 412 and connecting the nodes A 526 and B 528 of FIG. 5 to the nodes A 440 and B 442 of FIG. 4, respectively, and connecting VIP 507 to input 414 and VIN 508 to input 415.

Figure 6:
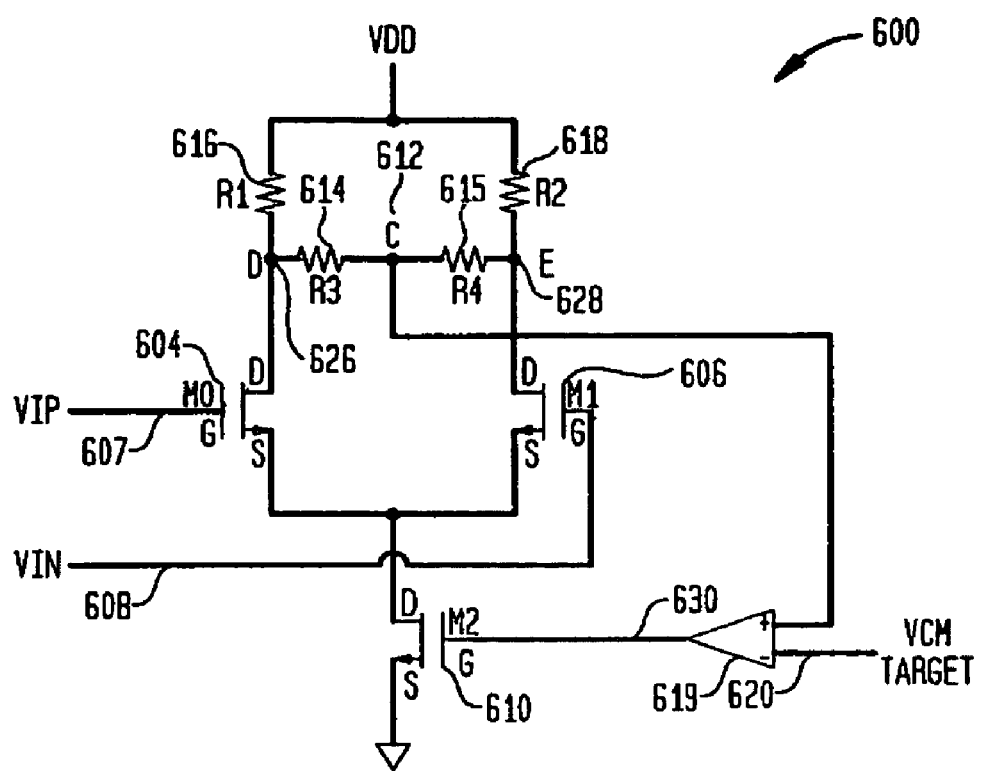
FIG. 6 illustrates an exemplary wideband differential amplifier which uses an alternate approach to setting the circuit's common mode voltage in accordance with the present invention.

FIG. 6 shows an exemplary wideband differential amplifier 600 in accordance with the present invention which uses an alternate approach to setting a circuit's common mode voltage. The thick gate oxide transistors M0 604 and M1 606 connect to the differential inputs VIP 607 and VIN 608, respectively. The resistors R1 616 and R2 618 are selected in the same manner as the corresponding resistors used in the wideband amplifier 500 of FIG. 5. Resistors R3 614 and R4 615 are used as a matched pair to provide a common mode voltage at node C 612. The node C 612 voltage is sensed in amplifier 619 which drives thick gate oxide transistor M2 610 to match the node C 612 voltage to a common mode (VCM) target voltage 620.

The wideband differential amplifier 600 of FIG. 6 with input thick gate oxide devices may be used as the first stage 412 in the two stage VGA 408 of FIG. 4. For example, the two stage VGA 408 input 414 corresponds to VIP 607 and the two stage VGA 408 input 415 corresponds to the VIN 608 in FIG. 6. The CMFB connection point 440 corresponds to D 626 and the CMFB connection point 442 corresponds to E 628. The CMFB output 446 corresponds to the amplifier 619 output 630.

A number of improvements to VGA designs may be achieved by utilizing the teachings of the present invention, for example, a reduction in input gate leakage current, an improvement in noise performance, and an improvement in the control of the common mode voltage. An advantage of the wideband differential amplifier 500 of FIG. 5 is the common mode voltage control is outside the signal path. An advantage of the wideband differential amplifier 600 of FIG. 6 is a tighter control of the common mode voltage.

Figure 7A:
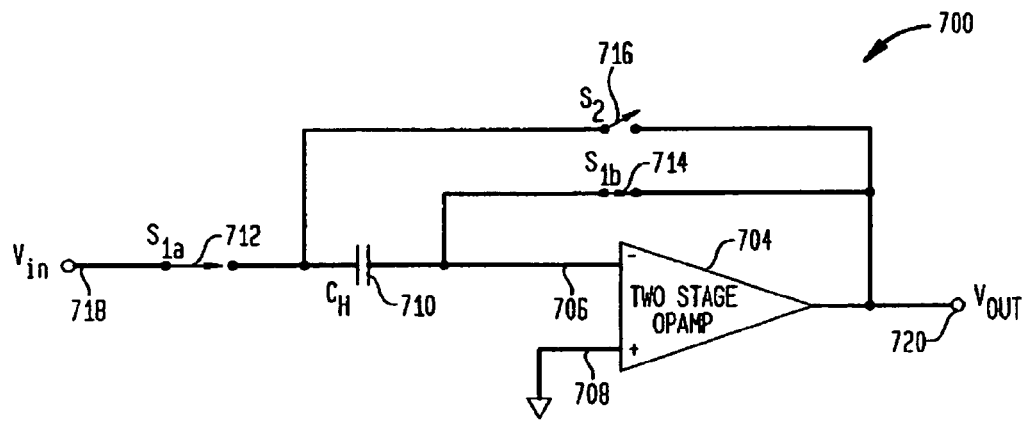
FIG. 7A illustrates a sample and hold circuit in a sample configuration in accordance with the present invention.

FIG. 7A shows a sample-and-hold (S/H) circuit 700 having a two stage OPAMP 704, with two stage OPAMP inputs 706 and 708, hold capacitor $C_H$ 710, switches S1$a$ 712, S1$b$ 714, and S2 716, an input voltage 718, and an output 720. In a system configuration, a sample and hold circuit may be connected, for example, to an analog to digital (A/D) converter to hold a voltage for a hold time that is adequate for A/D conversion. The hold time is dependent upon the hold capacitor $C_H$ 710 and the gate leakage current that affects the rate of discharge of the voltage being held on the hold capacitor $C_H$ 710. Having a low gate leakage current improves the holding time of the sample and hold circuit. The switches S1$a$ 712, S1$b$ 714, and S2 716 are controlled to configure the sample and hold circuit 700 in a sample configuration in which a signal is sampled, as illustrated in FIG. 7A, and in a hold configuration in which a signal is held, as illustrated in FIG. 7B.

The sample configuration of sample and hold circuit 700 shown in FIG. 7A is used to acquire an input voltage 718 and store the input voltage value in the capacitor $C_H$ 710. In this configuration the switches S1$a$ 712 and S1$b$ 714 are in a closed position and the switch S2 716 is in an open position. A logic sample control signal may be used, for example, to operate integrated circuit devices that correspond to the switches S1$a$ 712, S1$b$ 714, and S2 716.

Figure 7B:
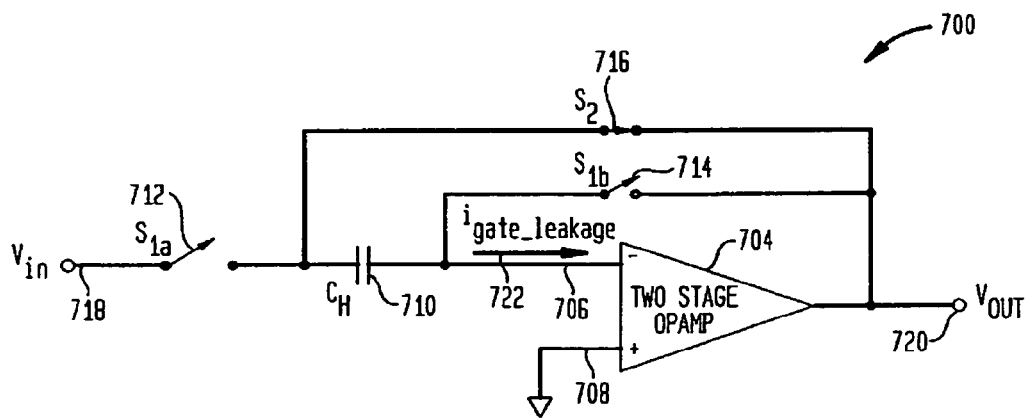
FIG. 7B illustrates a sample and hold circuit in a hold configuration in accordance with the present invention.

The hold configuration shown in FIG. 7B is used to hold the sampled input voltage 718 for some period of time and place the hold voltage on the two stage OPAMP output 720. In the hold configuration, the switches S1$a$ 712 and S1$b$ 714 are in an open position and the switch S2 716 is in a closed position. In the hold configuration, the voltage stored in capacitor $C_H$ 710 will discharge at some rate, referred to as a droop rate, in part due to the two stage OPAMP 704 input leakage current ($i_{gate\_leakage}$) 722. By using a two stage OPAMP 704 that incorporates thick gate oxide devices on inputs 706 and 708 in a wideband amplifier first stage of the OPAMP 704, according to the teachings of the present invention, the input gate leakage current may be minimized thereby maintaining the hold voltage with minimum degradation.

The wideband differential amplifiers 500 and 600 of FIGS. 5 and 6 with their thick gate oxide input devices may individually be used as a suitable input stage of sample and hold (S/H) circuit 700 of FIGS. 7A and 7B. For example, S/H circuit input 706 corresponds to the wideband differential amplifier inputs VIPs 507 and 607 of FIGS. 5 and 6. Correspondingly, S/H circuit input 708 corresponds to the wideband differential amplifier inputs VINs 508 and 608. The wideband differential amplifier input stage is connected to a second stage that uses thin oxide devices providing high performance characteristics for a two stage operational amplifier (OPAMP) 704. By use of the wideband differential amplifiers with thick gate oxide input devices as shown in FIGS. 5 and 6, sample and hold circuit input leakage current $i_{gate\_leakage}$ current 722 is kept low without affecting the performance of the two stage OPAMP 704.

FIG. 8 illustrates a method 800 of amplifying a signal with gain C, frequency response F, and low input gate leakage current in accordance with the present invention. In a first step 805 a read channel signal is received in a first stage circuit having a low input gate leakage current depending on the thickness of the first stage input gate oxide layer. The read channel may be a read channel as used in a perpendicular recording system, such as shown in FIG. 1. The read channel signal is amplified in step 810 by a first gain A and frequency response of at least F. The first gain A may be a moderate fixed gain, such as between 1× and 4×, for example, or may be a moderate variable gain having a range between 1× and 4×, for example. In step 815 after the amplification step, the amplified read channel signal is provided on a first stage output. The first stage output signal is received in a next step 820 in a second stage circuit having a frequency response and gain depending on the thickness of the second stage input gate oxide layer. The first stage output signal is amplified in step 825 by a second gain B and frequency response of at least F, where the second gain B is greater than the first gain A. The second gain B may be a fixed gain greater than the first gain A, such as, 10×, 25×, or 50x, for example, or may be a variable gain having a range between the first gain A and 50x, for example. In step 830 after the second stage amplification step 825, the amplified read channel signal is provided on a second stage output having been amplified by a gain C≅A*B. The amplified read channel signal can be further processed if required.

The combination of the amplification of the read channel signal by gain A followed by the amplification by gain B produces a total gain of ~A*B which is designed to meet the system requirements for the intended application. For example, the gain of the VGA 101 for the system 100 may be between 1x and 24x. This system gain may be distributed to the first amplification stage having a first gain of between 1x and 2x and the second stage having a second gain of between the first gain and 24x. The distribution of the gain between the first stage with a thick gate oxide input device and the second stage with a thin gate oxide input device allows the design constraints, such as, performance, input gate leakage current, and stable control of the common mode voltage, to be easily met in fabrication technologies of increasing transistor densities.

As technology scales to increasing densities and higher performance, such as scaling from 0.18 μm to 0.13 μm and to 0.09 μm (90 nanometers), for example, many problems are encountered as a result of scaling the active devices. For example, the thickness of the gate oxide layer of metal oxide semiconductor (MOS) devices decreases as the technology process scales. Since the gate oxide layer thickness affects device operating range, performance, and gate leakage current, adapting a design to technologies with higher transistor densities, as taught by the present invention, will become increasingly important.

While the present invention has been disclosed in a presently preferred context, it will be recognized that the present teachings may be adapted to a variety of contexts consistent with this disclosure and the claims that follow.

For example, the present invention specifically addresses a wideband amplifier with common-mode feedback used in perpendicular recording read channels to reduce the gate leakage current effects. It will appreciated that a wideband amplifier, with or without common-mode feedback, in general, can be used for many high performance differential or single-ended amplifiers. It will also be appreciated that variations in the wideband amplifier are feasible. For example, the output loading of the wideband amplifier can be though transistors instead of resistors. Also, the wideband amplifier can be made to support variable gains, which can be incorporated into the gain stage directly following the wideband amplifier. Other such modifications and adaptations to suit a particular design application will be apparent to those of ordinary skill in the art.

We claim:

1. A two stage analog amplifier circuit, comprising:
a first stage having an input device that receives an input signal at a first input gate, the first input gate having a thick gate oxide layer wherein the thickness of the thick gate oxide layer is chosen so that the first stage input device has a low input gate leakage current, the first stage producing a first stage output signal; and
a second stage having a second input device that receives the first stage output signal at a second input gate, the second input gate having a thin gate oxide layer wherein the thickness of the thin gate oxide layer is less than the thickness of the thick gate oxide layer of the first input gate, wherein the first stage is a wideband amplifier having a first stage gain that is limited to enhance the first stage frequency response, wherein the second stage has a second stage gain that is greater than the first stage gain and the second stage gain is limited to enhance the second stage frequency response, and wherein the combined first stage gain and second stage gain meet a required system gain that is a product of the first stage gain and the second stage gain.

2. The two stage analog amplifier circuit of claim 1 wherein the first stage has a gain that is greater than 1.

3. The two stage analog amplifier circuit of claim 1 wherein the thin gate oxide layer is about ⅔ the thickness of the gate oxide layer of the first stage input device.

4. The two stage analog circuit of claim 1 wherein the input device and the second stage input device are MOSFET transistors where the thickness of the MOSFET transistor's gate oxide layer decreases with increasing transistor gate leakage current density.

5. The two stage analog amplifier circuit of claim 1 wherein the two stage circuit is an operational amplifier whose first stage input is connected to a hold capacitor in a sample and hold circuit.

6. The two stage analog amplifier circuit of claim 1 wherein the two stage analog amplifier circuit is used in a read channel of a disk drive system.

7. The two stage analog amplifier circuit of claim 1 further comprises:
the first stage having a third input device that receives a second input signal at a third input gate, the third input gate having a thick oxide layer wherein the thickness of the thick gate oxide layer is chosen so that the third input device has a low input gate leakage current, the first stage producing a first stage second output signal in response to the second input signal; and
the second stage having a fourth input device that receives the first stage second output signal at a fourth input gate, the fourth input gate having a thin gate oxide layer wherein the thickness of the thin gate oxide layer is less than the thickness of the thick gate oxide layer of the third input gate.

8. A two stage analog amplifier circuit, comprising:
a first stage having an input device that receives an input signal at a first input gate, the first input gate having a thick gate oxide layer wherein the thickness of the thick gate oxide layer is chosen so that the first stage input device has a low input gate leakage current, the first stage producing a first stage output signal;
a second stage having a second input device that receives the first stage output signal at a second input gate, the second input gate having a thin gate oxide layer wherein the thickness of the thin gate oxide layer is less than the thickness of the thick gate oxide layer of the first input gate;
two first stage input devices used as differential inputs in a first stage of a two stage differential variable gain amplifier (VGA) circuit; and
two second stage input devices used as differential inputs in a second stage of the two stage differential VGA circuit, whereby the two stage differential VGA circuit is used in a read channel of a disk drive system.

9. The two stage analog amplifier circuit of claim 8 wherein the read channel reads media recorded with a perpendicular recording technology.

10. The two stage analog amplifier circuit of claim 8 wherein the first stage is a wideband amplifier having a first stage gain that is limited to enhance the first stage frequency response, the second stage has a second stage gain that is greater than the first stage gain and the second stage gain is limited to enhance the second stage frequency response, and wherein the combined first stage gain and second stage gain meet a required system gain that is a product of the first stage gain and the second stage gain.

11. A two stage differential amplifier circuit for a read channel, comprising:
 a first stage having differential input devices with input gates receiving a differential input signal, the input gates each having a thick gate oxide layer, wherein each of the differential input devices has a low input gate leakage current, the first stage having a common mode voltage (CMV) output, the first stage using a common mode signal to provide stable control over the common mode voltage output, the first stage producing a differential output signal; and
 a second stage having second differential input devices with second input gates receiving the differential output signal of the first stage, the second input gates each having a thin gate oxide wherein the thicknesses of the thin gate oxide layer is less than the thickness of the thick gate oxide layer of the first stage differential input devices, wherein the first stage is a wideband amplifier having a first stage gain that is limited to enhance the first stage frequency response, the second stage has a second stage gain that is greater than the first stage gain and the second stage gain is limited to enhance the second stage frequency response, and wherein the combined first stage gain and second stage gain meet a required system gain that is a product of the first stage gain and the second stage gain.

12. The two stage differential amplifier circuit of claim 11 wherein the common mode signal is a common mode feedforward signal used to control the first stage common mode voltage output by current mirroring whereby the first stage common mode voltage output is matched to an external target common mode voltage input.

13. The two stage differential amplifier circuit of claim 11 wherein the common mode signal is a common mode feedback (CMFB) signal based on sensing the common mode voltage (CMV) output of the first stage and using the CMFB signal to control the CMV output of the first stage to match a target common mode voltage input.

14. The two stage differential amplifier circuit of claim 11 further comprising:
 a resistor connected to a voltage source;
 an amplifier with a negative input connected to a second terminal of the resistor, a positive input connected to a common mode voltage target value, and an output;
 a first control device having an input gate connected to the amplifier output, a source node connected to the second terminal of the resistor, and a drain node;
 a second control device having an input gate connected to the drain of the first control device, a drain connected to the drain of the first control device, and a source connected to a reference voltage; and
 an input controlling device having an input gate connected to the input gate of the second controlling device, a source connected to a reference voltage, and a drain connected to the sources of both differential input devices, whereby the current through the second control device is mirrored into the input controlling device by device matching and whereby the circuit's CMV output is set.

15. The two stage differential amplifier circuit of claim 11 further comprising:
 a first resistor;
 a second resistor, the second resistor matched in value to the first resistor, the first resistor connected to the second resistor constituting a first node, the first resistor connected to the drain of one of the differential input thick oxide devices, and the second resistor connected to the drain of the other differential input thick oxide device;
 an input controlling device having an input gate, a source connected to a reference voltage, and a drain connected to the sources of both differential input devices; and
 an amplifier positive input connected to the first node, the amplifier negative input connected to a common mode voltage target value, and the amplifier output connected to the input gate of the input controlling device, whereby the input controlling device controls the voltage of the first node to match the common mode voltage target value.

16. A method for amplifying a read channel signal with a system gain, system frequency response, and low input gate leakage current, comprising:
 receiving a read channel signal in a first stage circuit having a low input gate leakage current depending on the thickness of the first stage input gate oxide layer;
 amplifying the received read channel signal by a first gain and first frequency response of at least the system frequency response;
 providing the amplified read channel signal on a first stage output;
 receiving the first stage output signal in a second stage circuit having a second frequency response and a second gain depending on the thickness of the second stage input gate oxide layer, wherein the thickness of the second stage input gate oxide layer is less than the thickness of the first stage input gate oxide layer,
 amplifying the received first stage output signal by the second gain and second frequency response of at least the system frequency response, wherein the second gain is greater than the first gain; and
 providing the amplified read channel signal on a second stage output, wherein the read channel signal is amplified by the system gain that is a product of the first gain and the second gain.

17. The method of claim 16 wherein the thick gate oxide layer of the first stage circuit input gate is about 1.5 times the thickness of the gate oxide layer of the second stage circuit input gate.

18. The method of claim 16 wherein the read channel signal is sourced from a read transducer in a perpendicular recording technology.

19. The method of claim 16 further comprising:
 sensing a common mode voltage of the first stage circuit;
 comparing the common mode voltage of the first stage circuit with a reference common mode voltage in a differential amplifier;
 adjusting the first stage circuit's common mode voltage based on the output of the differential amplifier.

20. The method of claim 16 further comprising:
 measuring a voltage comparable to a first stage common mode voltage in a separate feedforward common mode voltage circuit;
 comparing the measured voltage with a reference common mode voltage in a differential amplifier; and
 adjusting the first stage circuit's common mode voltage based on the output of the differential amplifier.

* * * * *